(12) United States Patent
Trygubova et al.

(10) Patent No.: US 10,681,844 B2
(45) Date of Patent: Jun. 9, 2020

(54) SELF-ADJUSTABLE HEAT SPREADER SYSTEM FOR SET-TOP BOX ASSEMBLIES

(71) Applicant: DISH Technologies L.L.C., Englewood, CO (US)

(72) Inventors: Svitlana Trygubova, Lakewood, CO (US); Morgan Kirby, Palmer Lake, CO (US)

(73) Assignee: DISH Technologies L.L.C., Englewood, CO (US)

( * ) Notice: Subject to any disclaimer, the term of this patent is extended or adjusted under 35 U.S.C. 154(b) by 0 days.

(21) Appl. No.: 16/386,065

(22) Filed: Apr. 16, 2019

(65) Prior Publication Data

US 2019/0246522 A1 Aug. 8, 2019

Related U.S. Application Data

(63) Continuation of application No. 14/986,065, filed on Dec. 31, 2015, now Pat. No. 10,356,948.

(51) Int. Cl.
*H05K 7/20* (2006.01)
*H05K 1/02* (2006.01)

(52) U.S. Cl.
CPC ....... *H05K 7/20509* (2013.01); *H05K 1/0201* (2013.01); *H05K 7/2049* (2013.01); *H05K 7/20454* (2013.01)

(58) Field of Classification Search
None
See application file for complete search history.

(56) References Cited

U.S. PATENT DOCUMENTS

| 5,801,330 A | 9/1998 | Gademann et al. |
| 6,049,469 A * | 4/2000 | Hood, III ............ H05K 9/0039 361/818 |

(Continued)

FOREIGN PATENT DOCUMENTS

| CN | 101959393 A | 1/2011 |
| CN | 102883202 A | 1/2013 |

(Continued)

OTHER PUBLICATIONS

Office Action received for CN 201680077468.8 dated Aug. 16, 2019, all pages.

(Continued)

*Primary Examiner* — Courtney L Smith

(57) ABSTRACT

Systems, electronic devices, and methods are directed to a self-adjustable heat spreader. A spring system may include one or more spring members and a contact surface adapted to contact a circuit board component. Each spring member may include a thermally conductive material. A thermal spreader plate may be coupled to the one or more spring members. The spring system and the thermal spreader plate may be configured to allow movement, with respect to the thermal spreader plate along multiple axes, of one or more portions of the one or more spring members proximate to the thermal spreader plate when the contact surface is pressed against the circuit board component and the spring system transitions from a first state to a compressed state. The contact surface and the spring system may be configured to transfer heat between the circuit board component and the thermal spreader plate.

20 Claims, 14 Drawing Sheets

(56) References Cited

U.S. PATENT DOCUMENTS

| | | |
|---|---|---|
| 6,212,074 B1 | 4/2001 | Gonsalves et al. |
| 6,226,184 B1 | 5/2001 | Stolz et al. |
| 6,791,183 B2 | 9/2004 | Kanelis |
| 7,130,193 B2 | 10/2006 | Hirafuji et al. |
| 7,203,065 B1 | 4/2007 | Too |
| 7,315,445 B2 | 1/2008 | Kirby et al. |
| 7,403,393 B2 | 7/2008 | Herring et al. |
| 7,916,485 B2 * | 3/2011 | Yu .............................. F28F 3/02 165/104.26 |
| 8,154,880 B1 | 4/2012 | Bicknell |
| 8,254,129 B2 * | 8/2012 | Okutsu .................... G06F 1/203 165/104.33 |
| 8,270,170 B2 * | 9/2012 | Hughes .............. H05K 7/20445 165/104.33 |
| 8,363,411 B2 | 1/2013 | Stephens et al. |
| 8,405,996 B2 * | 3/2013 | Shaddock .............. B82Y 30/00 165/185 |
| 8,544,745 B2 | 10/2013 | Mullins et al. |
| 8,766,093 B2 | 7/2014 | Lee |
| 8,902,588 B2 | 12/2014 | Ritter et al. |
| 8,947,881 B2 | 2/2015 | Puertolas et al. |
| 9,049,811 B2 * | 6/2015 | Subat ................ H05K 7/20445 |
| 9,220,185 B2 | 12/2015 | Ritter et al. |
| 9,265,180 B2 * | 2/2016 | Dernier ................ H05K 1/021 |
| 9,271,427 B2 | 2/2016 | Kilroy et al. |
| 9,668,377 B2 * | 5/2017 | Lim ..................... H05K 7/2039 |
| 10,356,948 B2 | 7/2019 | Trygubova et al. |
| 2004/0052052 A1 * | 3/2004 | Rivera ................ H01L 23/427 361/700 |
| 2004/0207985 A1 | 10/2004 | Delano et al. |
| 2005/0248923 A1 | 11/2005 | Hsu |
| 2006/0187645 A1 | 8/2006 | Numata |
| 2006/0215357 A1 | 9/2006 | Green et al. |
| 2007/0030656 A1 | 2/2007 | Ross et al. |
| 2007/0046313 A1 * | 3/2007 | Eldridge ................. H01L 24/72 324/750.03 |
| 2007/0146996 A1 | 6/2007 | Herring et al. |
| 2008/0053640 A1 * | 3/2008 | Mok ....................... F28D 15/02 165/104.33 |
| 2008/0180121 A1 * | 7/2008 | Khandros ............ H05K 3/4015 324/756.03 |
| 2010/0027220 A1 | 2/2010 | Hughes et al. |
| 2010/0097768 A1 | 4/2010 | Ishii et al. |
| 2012/0140417 A1 | 6/2012 | Aspas Puertolas et al. |
| 2013/0033823 A1 | 2/2013 | Nagashima et al. |
| 2013/0063895 A1 | 3/2013 | Ritter et al. |
| 2014/0022733 A1 | 1/2014 | Lim et al. |
| 2014/0146479 A1 | 5/2014 | Kilroy et al. |
| 2015/0230363 A1 * | 8/2015 | Dernier .................. H05K 1/021 174/548 |
| 2017/0196121 A1 | 7/2017 | Trygubova et al. |

FOREIGN PATENT DOCUMENTS

| | | |
|---|---|---|
| CN | 108702853 A | 10/2018 |
| EP | 3398413 | 11/2018 |
| WO | 2014/062974 A1 | 4/2014 |

OTHER PUBLICATIONS

International Search Report and Written Opinion for PCT/US2016/058196 dated Jan. 30, 2017, all pages.

International Preliminary Report on Patentability for PCT/US2016/058196 dated Jul. 3, 2018, all pages.

International Search Report and Written Opinion for PCT/US2018/050372 dated Dec. 19, 2018, all pages.

Prosecution history for U.S. Appl. No. 15/729,866, filed Oct. 11, 2017, First Named Inventor: Svitlana Trygubova, all pages.

* cited by examiner

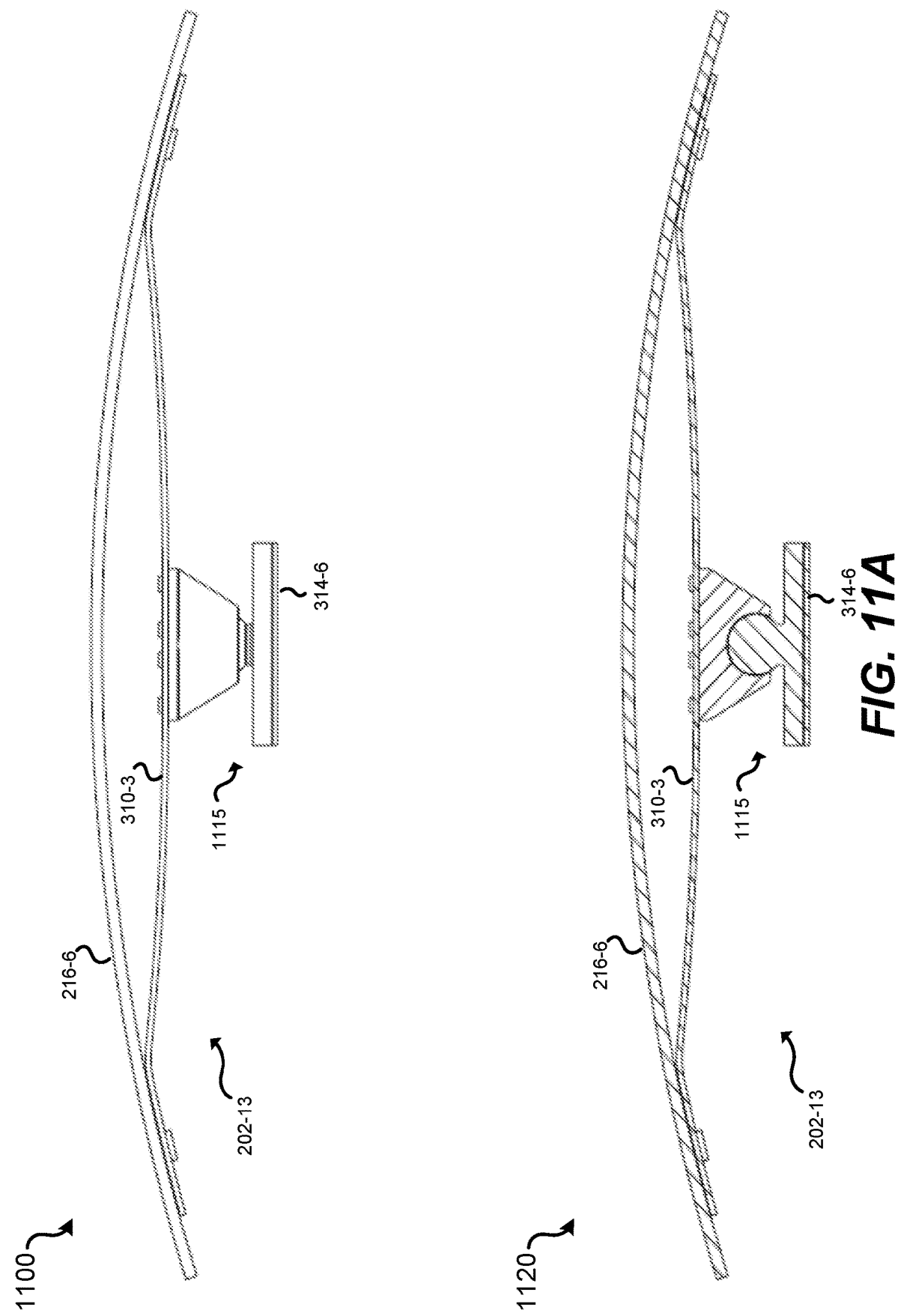

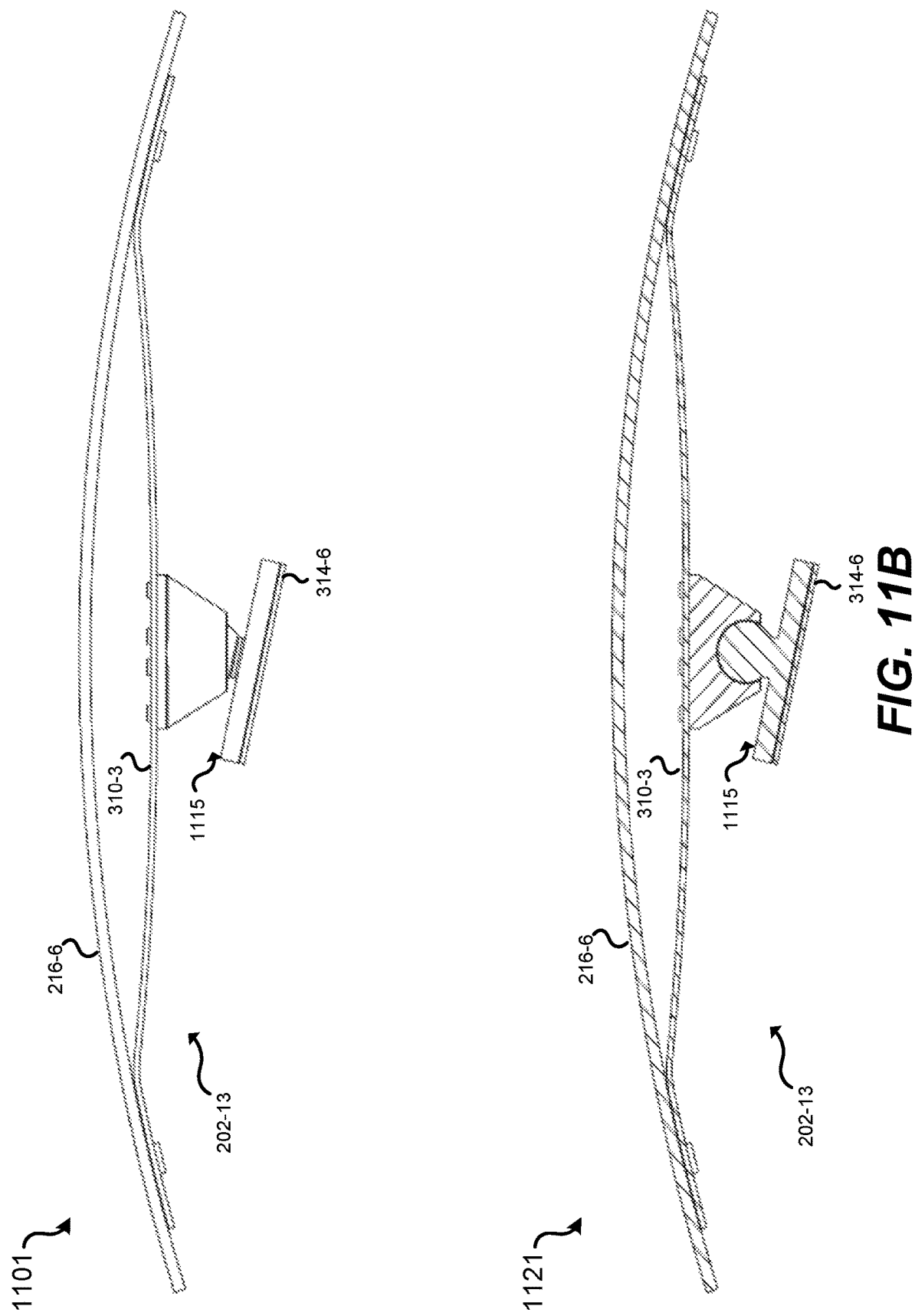

SELF-ADJUSTABLE HEAT SPREADER SYSTEM FOR SET-TOP BOX ASSEMBLIES

CROSS-REFERENCE TO RELATED APPLICATION

This application is a continuation of U.S. nonprovisional application Ser. No. 14/986,065, filed Dec. 31, 2015, entitled "SELF-ADJUSTABLE HEAT SPREADER SYSTEM FOR SET-TOP BOX ASSEMBLIES," the entire disclosure of which is incorporated herein by reference for all purposes.

BACKGROUND

The present disclosure relates in general to set-top box assemblies, and, more specifically, but not by way of limitation, to self-adjustable heat spreader systems for set-top box assemblies.

Certain components of set-top box assemblies for television receivers, such microprocessor chips and other circuit board devices, are sources of heat. Design variables of set-top box assemblies for television receivers, of set-top box enclosures for the set-top box assemblies, of circuit board assemblies for the set-top box assemblies, of circuit board components for the circuit board assemblies, and/or the like create problems for effectively handling heat produced by the devices. In many instances, there exists a gap between a circuit board component and a top cover of an enclosure of a set-top box assembly for a television receiver. Thus, oftentimes, an opposing cover and/or opposing devices float above the circuit board component.

There is a need in the set-top box assembly space for solutions to these problems that address wide variations of design tolerances, including variations in gaps between circuit board components and other structural components. This and other needs are addressed by the present disclosure.

BRIEF SUMMARY

The present disclosure relates in general to set-top box assemblies, and, more specifically, but not by way of limitation, to self-adjustable heat spreader systems for set-top box assemblies.

In one aspect, a self-adjustable heat spreader system is disclosed. The self-adjustable heat spreader system may include any one or combination of the following. A spring system may include one or more spring members and a contact surface adapted to contact a circuit board component. Each spring member of the one or more spring members may include a thermally conductive material. A thermal spreader plate may be coupled to the one or more spring members. The spring system and the thermal spreader plate may be configured to allow movement, with respect to the thermal spreader plate along multiple axes, of one or more portions of the one or more spring members proximate to the thermal spreader plate when the contact surface is pressed against the circuit board component and the spring system transitions from a first state to a compressed state. The contact surface and the spring system may be configured to transfer heat between the circuit board component and the thermal spreader plate.

In another aspect, an electronic device is disclosed. The electronic device may include an enclosure that may enclose any one or combination of the following. A spring system may include one or more spring members and a contact surface adapted to contact a circuit board component. Each spring member of the one or more spring members may include a thermally conductive material. A thermal spreader plate may be coupled to the one or more spring members. The spring system and the thermal spreader plate may be configured to allow movement, with respect to the thermal spreader plate along multiple axes, of one or more portions of the one or more spring members proximate to the thermal spreader plate when the contact surface is pressed against the circuit board component and the spring system transitions from a first state to a compressed state. The contact surface and the spring system may be configured to transfer heat between the circuit board component and the thermal spreader plate.

In yet another aspect, a method of assembling an electronic device is disclosed. The method may include assembling within an enclosure any one or combination of the following. A spring system may include one or more spring members and a contact surface adapted to contact a circuit board component. Each spring member of the one or more spring members may include a thermally conductive material. A thermal spreader plate may be coupled to the one or more spring members. The spring system and the thermal spreader plate may be configured to allow movement, with respect to the thermal spreader plate along multiple axes, of one or more portions of the one or more spring members proximate to the thermal spreader plate when the contact surface is pressed against the circuit board component and the spring system transitions from a first state to a compressed state. The contact surface and the spring system may be configured to transfer heat between the circuit board component and the thermal spreader plate.

In various embodiments, the one or more portions of the one or more spring members may abut the thermal spreader plate and slide along the thermal spreader plate when the contact surface is pressed against the circuit board component and the spring system transitions from the first state to a compressed state. In various embodiments, the first state may correspond to an uncompressed state of the spring system. In various embodiments, the contact surface may correspond to at least a portion of a thermally conductive piece coupled to each spring member of the one or more spring members. In various embodiments, the thermal spreader plate may be coupled to the enclosure.

In various embodiments, a second spring system may include a second set of one or more spring members and a second contact surface, where each spring member of the second set of one or more spring members may be thermally conductive. A second thermal spreader plate may be coupled to the second set of one or more spring members. The spring system, the thermal spreader plate, the second spring system, and the second thermal spreader plate may be disposed in opposing positions to contact a circuit board and/or the circuit board component.

In various embodiments, a second spring system may include a second set of one or more spring members and a second contact surface, where each spring member of the second set of one or more spring members is thermally conductive. A second thermal spreader plate may be coupled to the second set of one or more spring members. The second spring system and the second thermal spreader plate may be configured to allow the seconds contact surface is pressed against a second circuit board component when the second spring system transitions to a second compressed state. The circuit board component and the second circuit board component may be disposed in different planes.

Further areas of applicability of the present disclosure will become apparent from the detailed description provided hereinafter. It should be understood that the detailed description and specific examples, while indicating various embodiments, are intended for purposes of illustration only and are not intended to necessarily limit the scope of the disclosure.

BRIEF DESCRIPTION OF THE DRAWINGS

A further understanding of the nature and advantages of various embodiments may be realized by reference to the following figures. In the appended figures, similar components or features may have the same reference label. Further, various components of the same type may be distinguished by following the reference label by a dash and a second label that distinguishes among the similar components. When only the first reference label is used in the specification, the description is applicable to any one of the similar components having the same first reference label irrespective of the second reference label.

FIG. 11A illustrates a side view and a cross-section of a heat spreader assembly configured to allow for heater spreader adjustment along three axes, in accordance with certain embodiments of the present disclosure.

FIG. 11B illustrates a side view and a cross-section of the heat spreader assembly in one non-limiting example state of adjustment with respect to two axes, in accordance with certain embodiments of the present disclosure.

DETAILED DESCRIPTION

Figure 1:
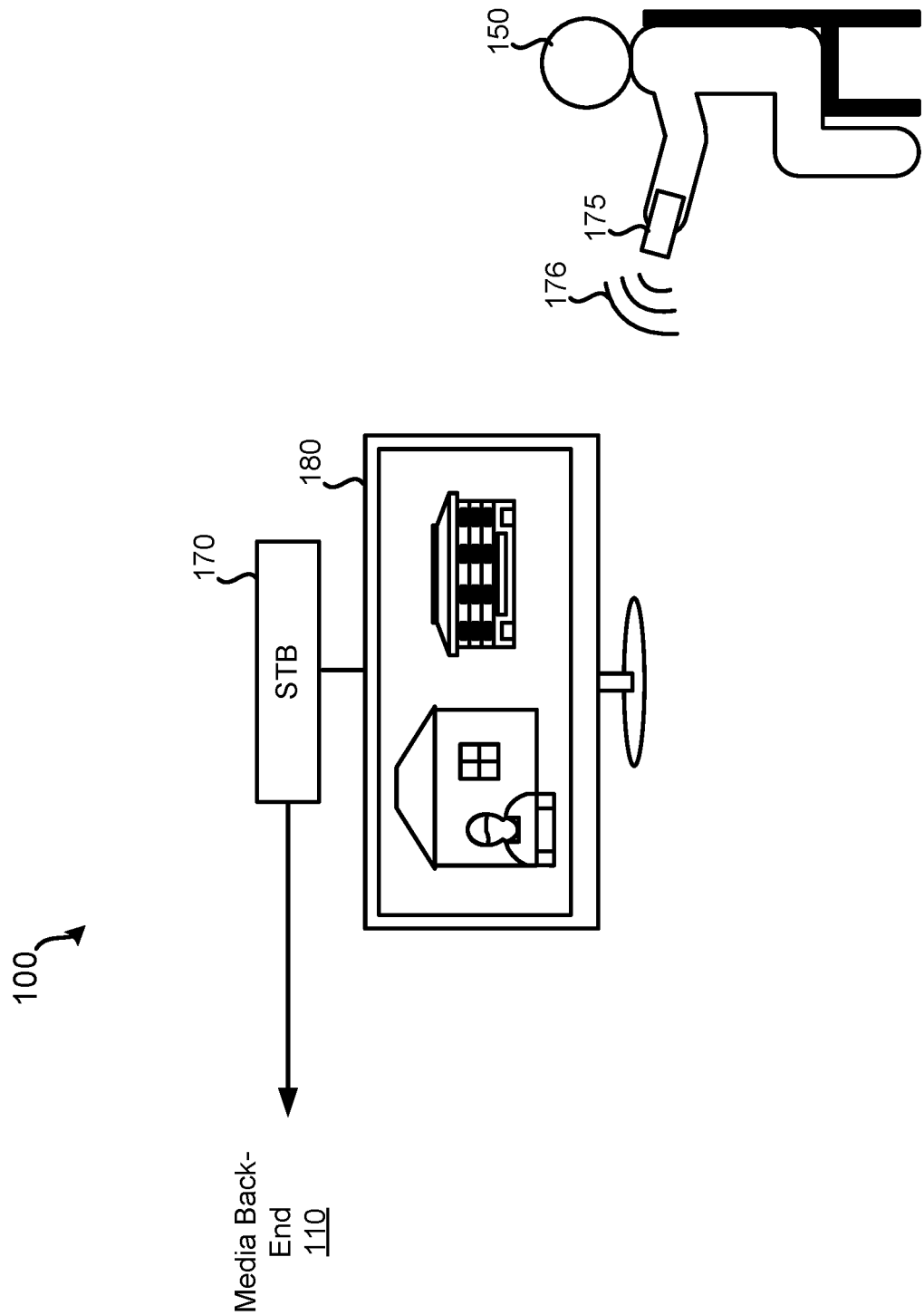
FIG. 1 illustrates an end-user system, in accordance with certain embodiments of the present disclosure.

The ensuing description provides preferred exemplary embodiment(s) only, and is not intended to limit the scope, applicability or configuration of the disclosure. Rather, the ensuing description of the preferred exemplary embodiment(s) will provide those skilled in the art with an enabling description for implementing a preferred exemplary embodiment of the disclosure. It should be understood that various changes may be made in the function and arrangement of elements without departing from the disclosure as set forth in the appended claims.

Specific details are given in the following description to provide a thorough understanding of the embodiments. However, it will be understood by one of ordinary skill in the art that the embodiments maybe practiced without these specific details. For example, circuits may be shown in block diagrams in order not to obscure the embodiments in unnecessary detail. In other instances, well-known circuits, processes, algorithms, structures, and techniques may be shown without unnecessary detail in order to avoid obscuring the embodiments.

Also, it is noted that the embodiments may be described as a process which is depicted as a flowchart, a flow diagram, a data flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed, but could have additional steps not included in the figure. A process may correspond to a method, a function, a procedure, a subroutine, a subprogram, etc. When a process corresponds to a function, its termination corresponds to a return of the function to the calling function or the main function.

The present disclosure relates in general to set-top box assemblies, and, more specifically, but not by way of limitation, to self-adjustable heat spreader systems for set-top box assemblies. As previously noted, certain components of set-top box assemblies for television receivers, such microprocessor chips and other circuit board devices, are sources of heat. Design variables of set-top box assemblies for television receivers, of set-top box enclosures for the set-top box assemblies, of circuit board assemblies for the set-top box assemblies, of circuit board components for the circuit board assemblies, and/or the like create problems for effectively handling heat produced by the devices. In many instances, there exists a gap between a circuit board component and a top cover of an enclosure of a set-top box assembly for a television receiver. Thus, oftentimes, an opposing cover and/or opposing devices float above the circuit board component.

Certain embodiments of the present disclosure may solve the accumulative tolerance problems and the heat problems simultaneously. Certain embodiments may provide for a thermal solution that efficiently utilizes a gap between a circuit board component and a cover of an enclosure of a set-top box assembly for a television receiver. Certain embodiments may provide for a self-adjustable heat spreader system that is flexible to accommodate design variables of set-top box assemblies for television receivers, set-top box enclosures, of circuit board assemblies, circuit board components, and/or the like. With self-adjustable heat spreader systems according to certain embodiments, set-top box assemblies for television receivers may achieve power savings, improved energy use, improved efficiency, and improved device functioning, capabilities, and performance.

Various embodiments will now be discussed in greater detail with reference to the accompanying figures, beginning with FIG. 1.

FIG. 1 illustrates an end-user system 100, in accordance with certain embodiments of the present disclosure. FIG. 1 is a simplified illustration of an embodiment of an end-user system 100, in accordance with certain embodiments of the present disclosure. The end-user system 100 may include the television tuner device 170, which may be a set-top box (STB) in certain embodiments, and an end-user display device 180. The display 180 can be controlled by a user 150 using a user input device 175 that can send wireless signals 176 to communicate with the television tuner device 170 and/or display 180. The media service back-end 110 may provide media in various forms.

Figure 2A:
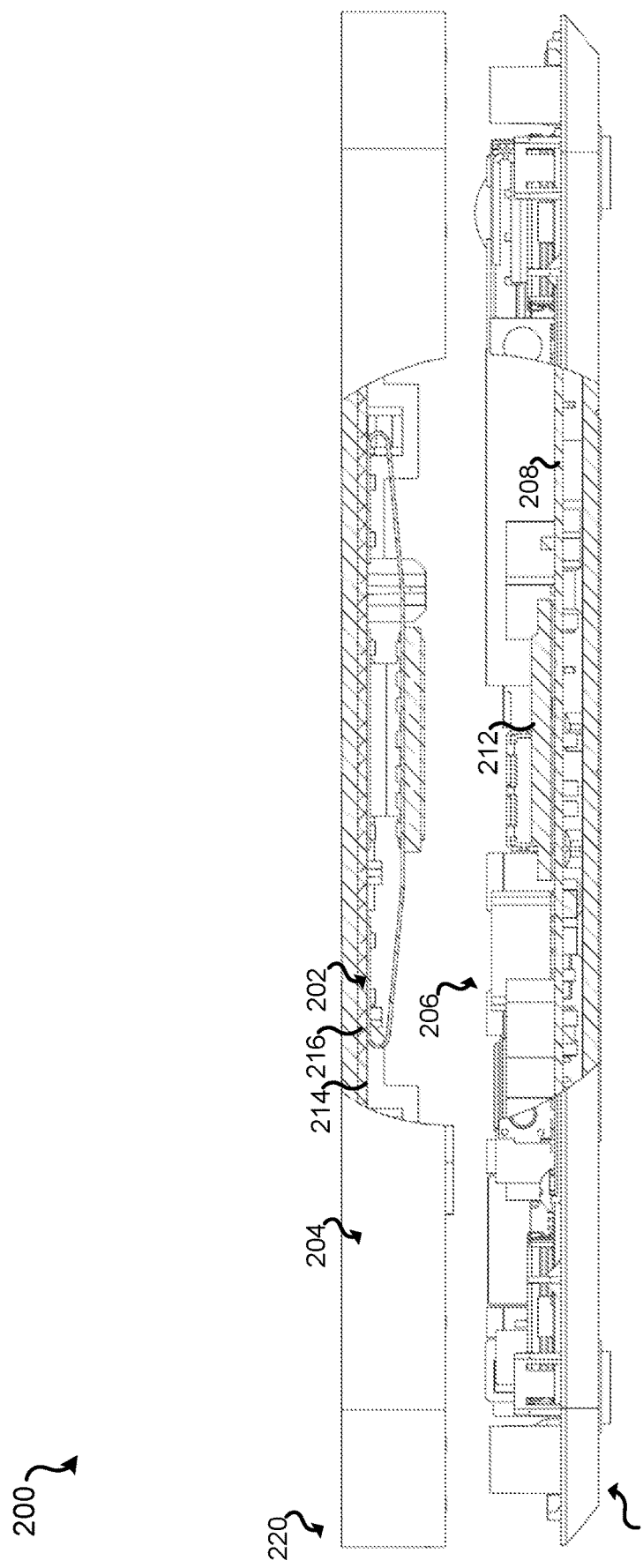
FIG. 2A illustrates a schematic, partial cross-sectional view of a set-top box assembly in a partially exploded state, in accordance with certain embodiments of the present disclosure.

FIG. 2A illustrates a schematic, partial cross-sectional view of a set-top box assembly 200 in a partially exploded state, in accordance with certain embodiments of the present disclosure. In FIG. 2A, a heat spreader system 202 is in a non-compressed state within an enclosure 204 of the set-top box assembly 200. The set-top box assembly 200 may include a first portion 210 and a second portion 220 that may be assembled together and that comprise the set-top box assembly 200. In the non-limiting example depicted, the first portion 210 corresponds to a lower assembly portion, whereas the second portion 220 corresponds to an upper assembly portion.

The set-top box assembly 200 may include the enclosure 204, which may be included the second portion 220 as depicted, and/or in the first portion 210 in various embodiments. Within the first portion 210, there may be circuit components 206 arranged on a substrate 208 (which may be circuit board). The circuit components 206 may include one or more heat producing components 210. For example, the heat producing components 212 may correspond to a circuit board component, such as a microprocessor, an integrated circuit chip, and/or another chip component, in various embodiments.

In the non-limiting example depicted, the opposing second portion 220 may include the heat spreader system 202, though other embodiments may have the first position 210 including the heat spreader system 202. The heat spreader assembly 202 may be attached, removably attached, slidably attached, and/or attachable to a surface 214 of the second portion 220. In some embodiments, the surface 214 may correspond to the enclosure 204. In some embodiments, as depicted in the non-limiting example, the surface 214 may correspond to a substrate 216 such that the heat spreader assembly 202 does not directly abut the enclosure 204. Thus, in various embodiments, the heat spreader assembly 202 may be directly or indirectly coupled to the enclosure 204.

Figure 2B:
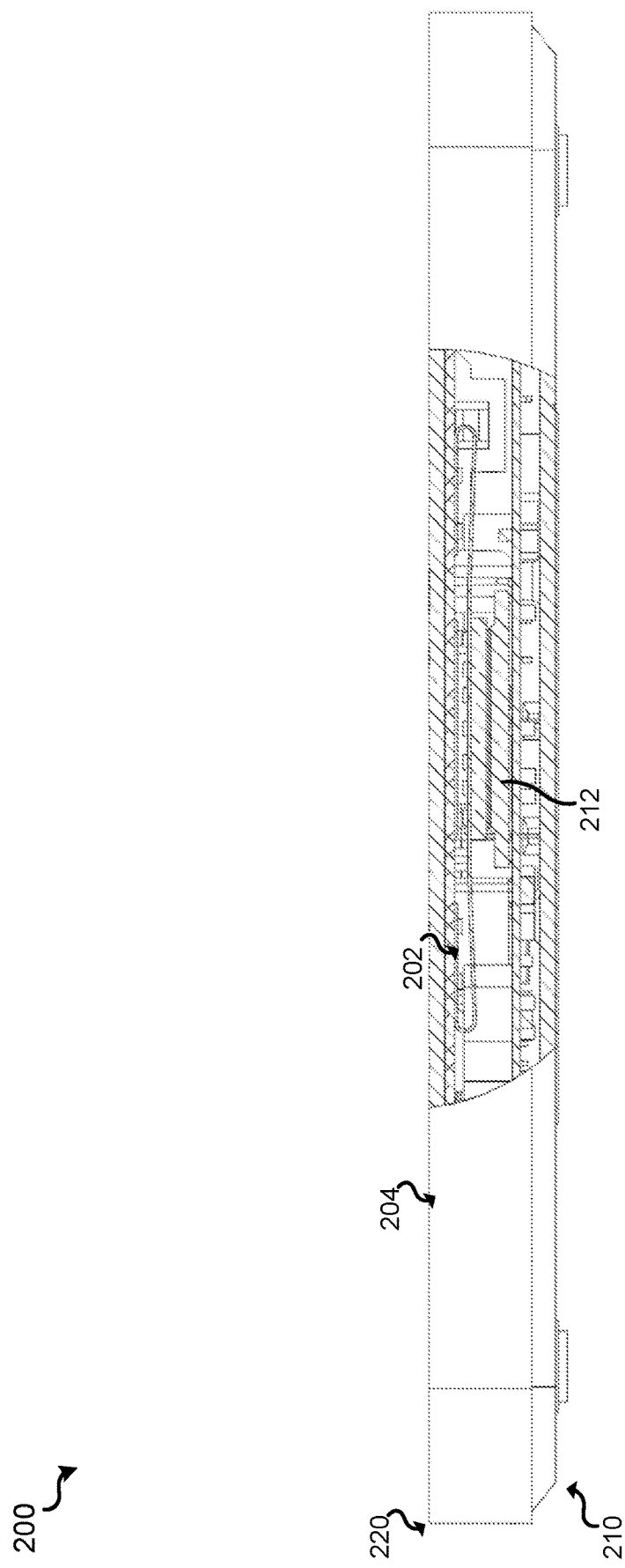
FIG. 2B illustrates a schematic, partial cross-sectional view of the set-top box assembly in an assembled state, in accordance with certain embodiments of the present disclosure.

FIG. 2B illustrates a schematic, partial cross-sectional view of the set-top box assembly 200 in an assembled state, in accordance with certain embodiments of the present disclosure. In the non-limiting example depicted, the first portion 210 is shown as assembled with the second portion 220. The first portion 210 may include a base adapted to receive the second portion 220. The first portion 210 and the second portion 220 may be assembled and attached to one another in any suitable manner. In FIG. 2B, the heat spreader system 202 is depicted in a compressed state within the enclosure 204 of the set-top box assembly 200 when the first portion 210 and the second portion 220 are assembled together. In the compressed state, the heat spreader system 202 has come into contact with the heat producing component 212.

Figure 3:
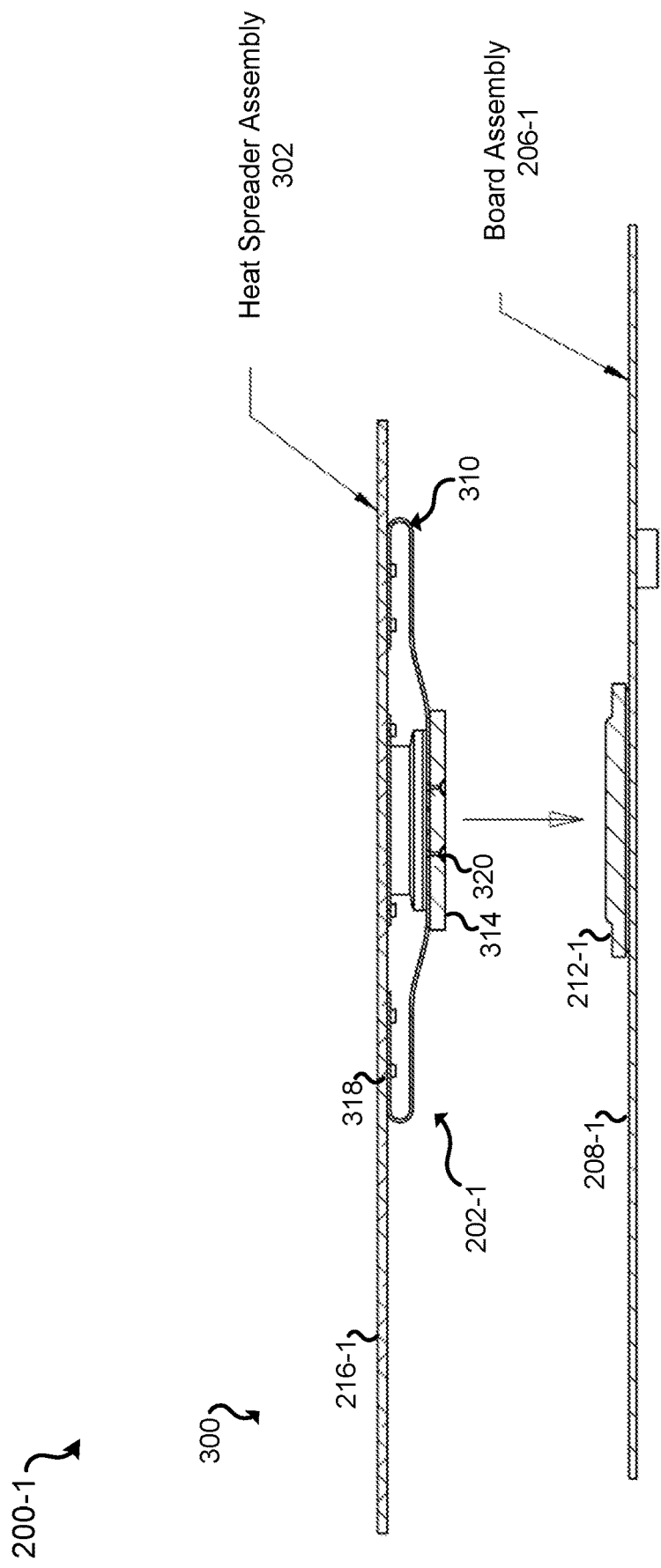
FIG. 3 illustrates a cross-section of a portion of the set-top box assembly in an exploded state, in accordance with certain embodiments of the present disclosure.

FIG. 3 illustrates a cross-section of a portion 300 of a set-top box assembly 200-1 in an exploded state, in accordance with certain embodiments of the present disclosure. A heat spreader assembly 302 may be disposed opposite a board assembly 206-1. The board assembly 206-1 may have disposed thereon a heat producing component 212-1, which may be a circuit board component.

The heat spreader assembly 302 may be configured to self-adjust to contact the heat producing component 212-1. In some embodiments, the heat spreader assembly 302 may be configured to assist in supporting the heat producing component 212-1 in place against the assembly board or other substrate 208-1. In some embodiments, the heat spreader assembly 302 may be configured to lock the heat producing component 212-1 in place against the assembly board or other substrate 208-1. Further, with certain embodiments, the heat spreader assembly 302 may not directly contact the heat producing component 212-1, but may indirectly contact the heat producing component 212-1 by way of one or more intermediate heat transferring components.

The heat spreader assembly 302 may include the heat spreader system 202-1, which may correspond to a thermally conductive spring system 202-1. In various embodiments, the heat spreader system 202-1 may be attached, fixedly attached, removably attached, and/or attachable to the substrate 216-1. In some embodiments, the heat spreader system 202-1 may be adjustably attached to the substrate 216-1. For example, the heat spreader system 202-1 may include a sliding mechanism so that at least a portion of the heat spreader system 202-1 proximate to and/or abutting the substrate 216-1 may move (e.g., slide) in two or more directions with respect to the substrate 216-1. Hence, some embodiments include sliding mechanism that that allow for multi-axial adjustment so that at least a portion of the heat spreader system 202-1 proximate to and/or abutting the substrate 216-1 may slide with respect multiple axes.

In various embodiments, the substrate 216-1 may be the enclosure 204 or a portion of the enclosure 204. The enclosure 204 may correspond to an exterior portion of the set-top box assembly 200-1 (e.g., an exterior cover). In various embodiments, the substrate 216-1 may be attached directly or indirectly to the enclosure 204. While the non-limiting example depicted illustrate the substrate 216-1 in one particular position and orientation, the substrate 216-1 may be disposed at different positions in various embodiments. For example, the substrate 216-1 may be positioned along with a side cover, bottom cover, a cover having a surface at one or more oblique angles with respect to a bottom reference surface, etc.

The heat spreader system 202-1 may be an integrated, thermally conductive spring system that conducts heat from the heat producing component 212-1 to a surface of the substrate 216-1 of the set-top box assembly 200. The heat spreader system 202-1 may include one or more thermally conductive spring members 310. In some embodiments, the one or more thermally conductive spring members 310 may be swaged to the thermal expansion plate 216.

Certain embodiment of the heat spreader system 202-1 may include thermal conductors 318 that extend from the spring members 310 (in some embodiments, through the spring members 310) into the substrate 216-1. The thermal conductors 318 may facilitate heat transfer from the heat spreader system 202-1 (e.g., from the spring members 310)

to the substrate 216-1. With some embodiments, the thermal conductors 318 may extend into, through, and beyond the substrate 216-1. The thermal conductors 318 facilitate heat transfer from the heat spreader system 202-1 to the substrate 216-1 and beyond the substrate 216-1 to one or more other media such as the enclosure 204, ambient air, a thermal expansion plate, and/or the like. In some embodiments, the thermal conductors 318 may facilitate attachment of the heat spreader system 202-1 to the substrate 216-1.

The one or more thermally conductive spring members 310 may be attached to a thermally conductive block 314 and configured such that the thermally conductive block 314 may be configured to make contact with the heat producing component 212-1 and/or one or more intermediate heat transferring components. Though the thermally conductive block 314 may have a block form in some embodiments, the thermally conductive block 314 may have a non-block form in other embodiments (e.g., a circular shaped pad or any suitable geometric form). With some embodiments, the thermally conductive block 314 may be formed to be integral with the one or more thermally conductive spring members 310. In some embodiments, the thermally conductive block 314 may be swaged the one or more thermally conductive spring members 310. In various embodiments, the thermally conductive block 314 may be attached, fixedly attached, removably attached, slidably attached, pivotably attached, and/or attachable to the one or more thermally conductive spring members 310. With certain embodiments, the thermally conductive block 314 may be attached to the one or more thermally conductive spring members 310 with one or more connectors 320, which may be thermally conductive to further facilitate heat transfer from the thermally conductive block 314 to the thermally conductive spring members 310. The one or more connectors 320, in various embodiments, may include one or more sliding mechanisms (e.g., sliding connectors) and/or one or more pivoting mechanisms (e.g., ball-socket connectors) so that the thermally conductive block 314 may move (e.g., slide or tilt) in two or more directions and/or orientations with respect to the spring members 310. Hence, some embodiments may provide a point of articulation and/or single- or multi-axial adjustment for the thermally conductive block 314.

Figure 4:
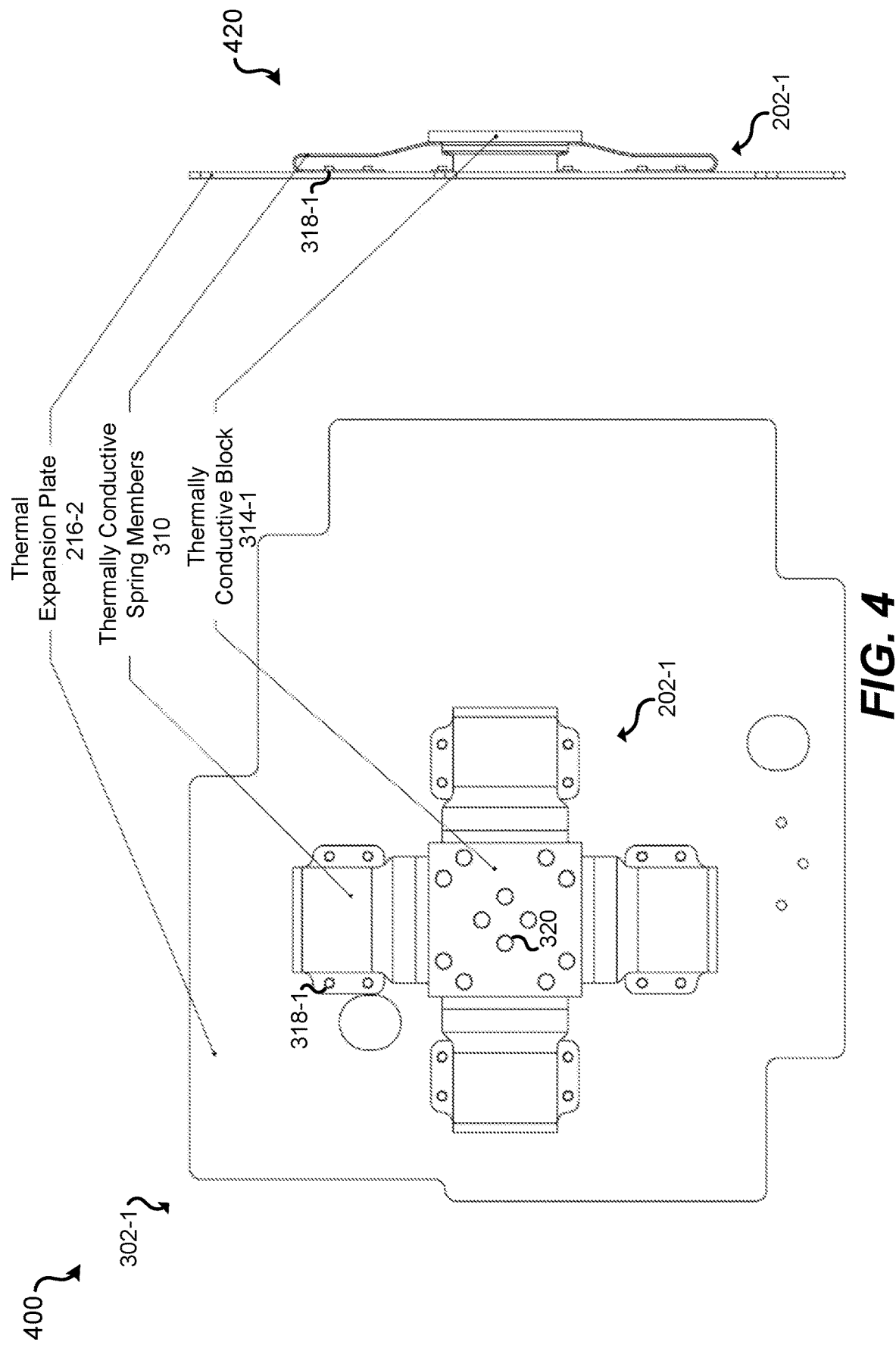
FIG. 4 illustrates a top view and a side view of the heat spreader assembly, in accordance with certain embodiments of the present disclosure.

FIG. 4 illustrates a top view 400 and a side view 420 of the heat spreader assembly 302-1, in accordance with certain embodiments of the present disclosure. As depicted, the heat spreader assembly 302-1 may include a thermal expansion plate 216-2. In some embodiments, the thermal expansion plate 216-2 may correspond to the substrate 216, 216-1. The top view 400 depicts the heat spreader assembly 302 with a four-spring spring system 202-1. The multiple spring system embodiments may be configured to ensure that balanced forces are applied to circuit board components. Various embodiments may provide thermally conducive spring systems 202 based on a different number of spring members, such as one spring member, two spring members, three spring members, five spring members, or more spring members.

The components of the heat spreader assembly 302 may be made of any one or combination of suitably conductive materials. For example, in some embodiments, the thermal expansion plate 216 may be or otherwise include aluminum. As another example, in some embodiments, the one or more thermally conductive spring members 310 and/or the thermally conductive block 314 may be or otherwise include copper. In various embodiments in the alternative or in addition, the thermal expansion plate 216, the one or more conductive spring members 310, and/or the block 314 may include one or more other thermally conductive materials. In the one or more conductive spring members 310, the balance between the conductive characteristics and the spring characteristics may be optimized. For example, greater forces imparted by the spring characteristics may correspond to some extent to greater conductivity as the greater forces ensure strong contact that leads to better heat transferring. Conversely, weaker forces imparted by the spring characteristics may correspond to some extent to weak contact and less heat transfer. The spring characteristics may be optimized for limited distances of travel. By way of example without limitation, accumulative tolerances for a contact surface of a chip may be ±1.0 mm, which may require taking into account 2.0 mm while still imparting strong contact. Further, the spring characteristics may be optimized for ranges of acceptable forces that may be applied to circuit board components, which ranges may be based at least in part on staying within limits specified for particular circuit board components.

Figure 5:
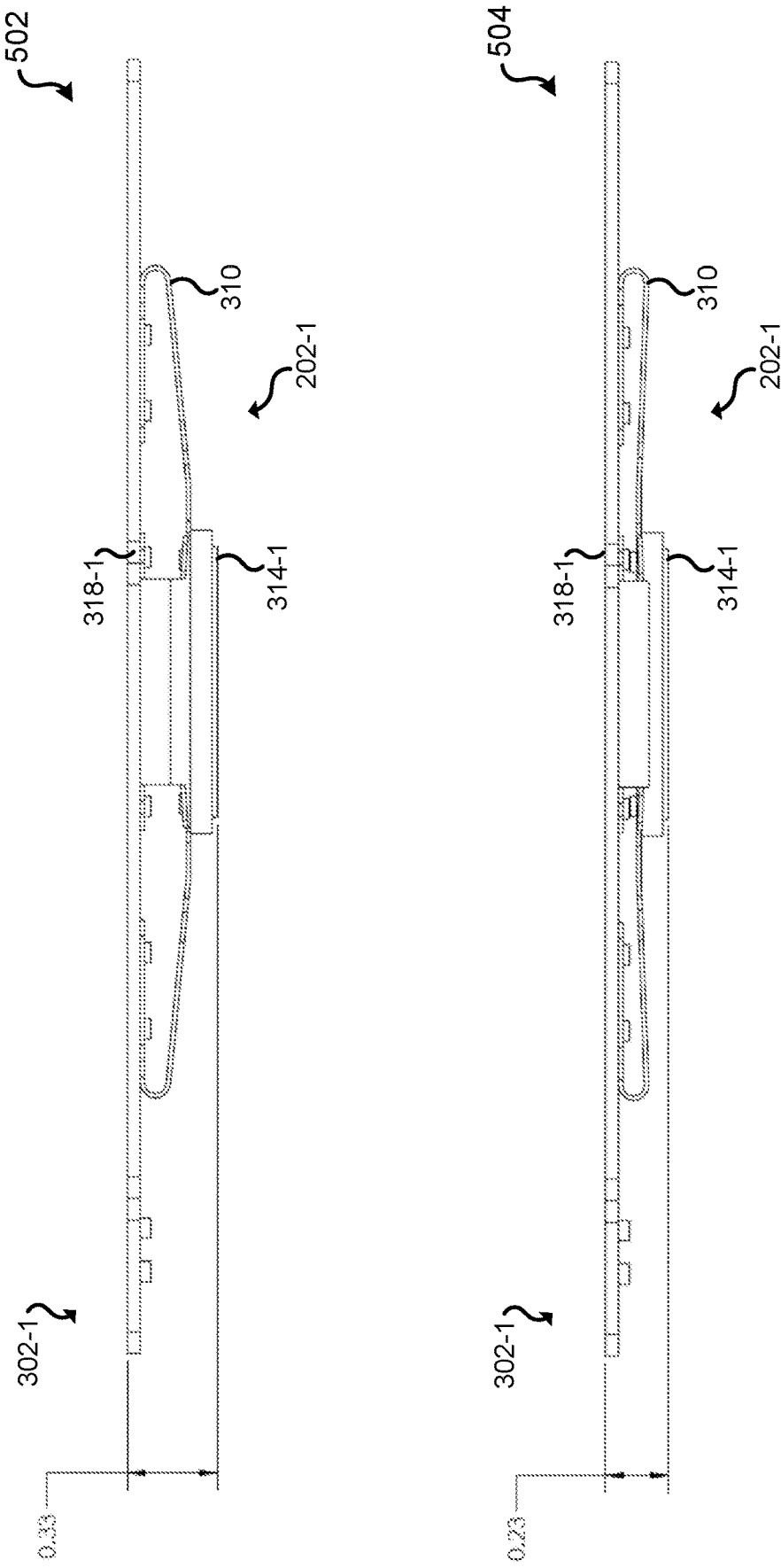
FIG. 5 illustrates a cross-sectional view of the heat spreader assembly in an expanded state and a cross-sectional view of the heat spreader assembly in a compressed state, in accordance with certain embodiments of the present disclosure.

FIG. 5 illustrates a cross-sectional view 502 of the heat spreader assembly 302-1 in an expanded state and a cross-sectional view 504 of the heat spreader assembly 302-1 in a compressed state, in accordance with certain embodiments of the present disclosure. During the process of assembling the set-top box assembly 200, the thermally conductive block 314 may contact the circuit board component 212 first, then the spring system 202 may flex until the unit cover of the enclosure 204 is completely closed. The spring system 202 may ensure that the thermally conductive block 314 contacts and is biased against the circuit board component 212, and may transfer the heat away at the same time.

Figure 6:
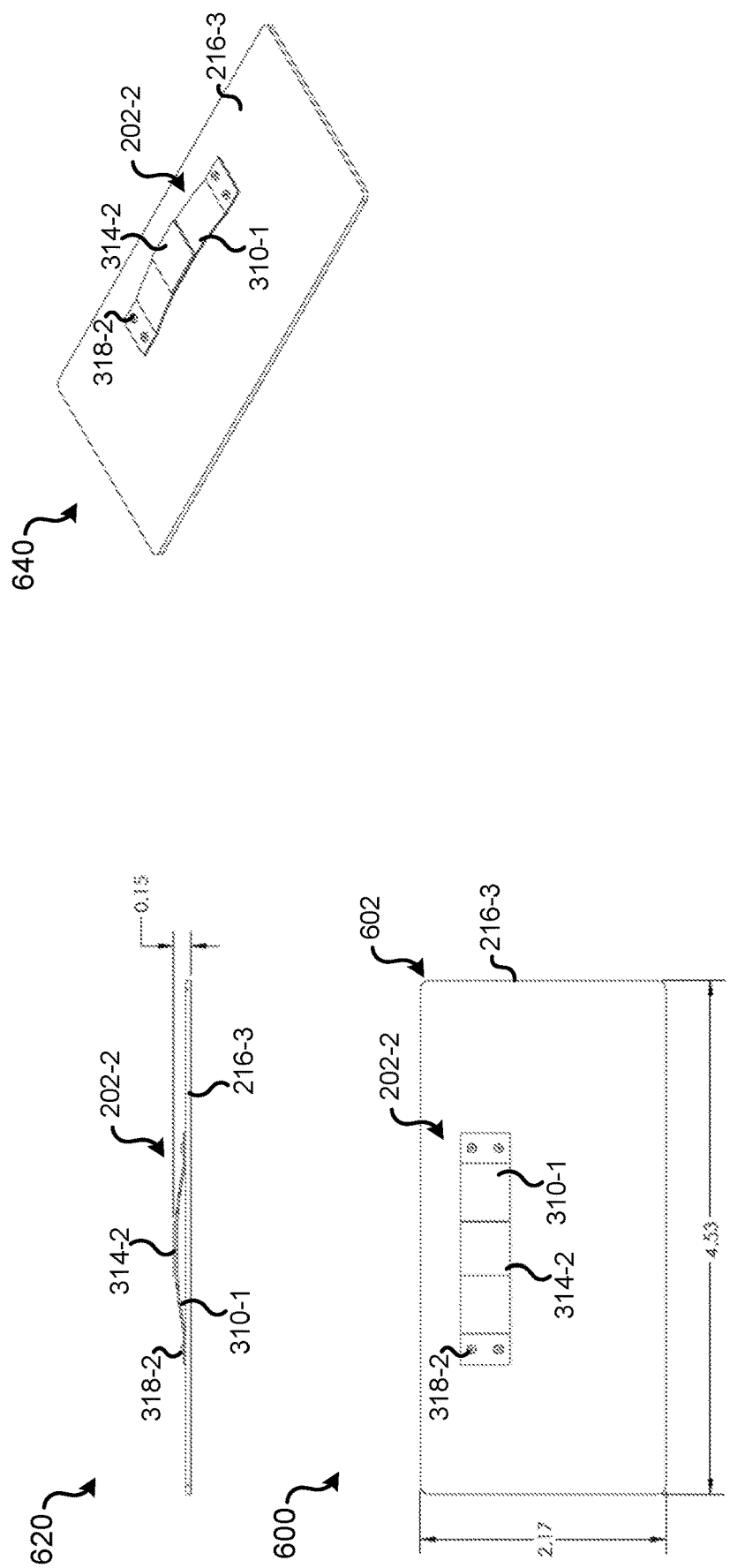
FIG. 6 illustrates a top view, a side view, and a perspective view of the heat spreader assembly, in accordance with certain embodiments of the present disclosure.

FIG. 6 illustrates a top view 600, a side view 620, and a perspective view 640 of a heat spreader assembly 602, in accordance with certain embodiments of the present disclosure. As depicted, the heat spreader assembly 602 may include a thermal expansion plate 216-3. Attached to the thermal expansion plate 216-3 may be a closed spring system 202-2. In the non-limiting example depicted, the closed spring system 202-2 may include two conductive spring members 310 coupled together with the thermally conductive block 314. In an alternative embodiment of the non-limiting example depicted, the closed spring system 202-2 may include one integral conductive spring members 310 formed to have two wings, each wing having an end portion coupled to the thermal expansion plate 216-3. While certain embodiments may include the thermally conductive block 314, certain embodiments of the heat spreader assembly 602 may not include the thermally conductive block 314 to contact the circuit board component 212. Accordingly, is some embodiments, the closed spring system 202-2 may be adapted to directly contact the circuit board component 212.

Figure 7:
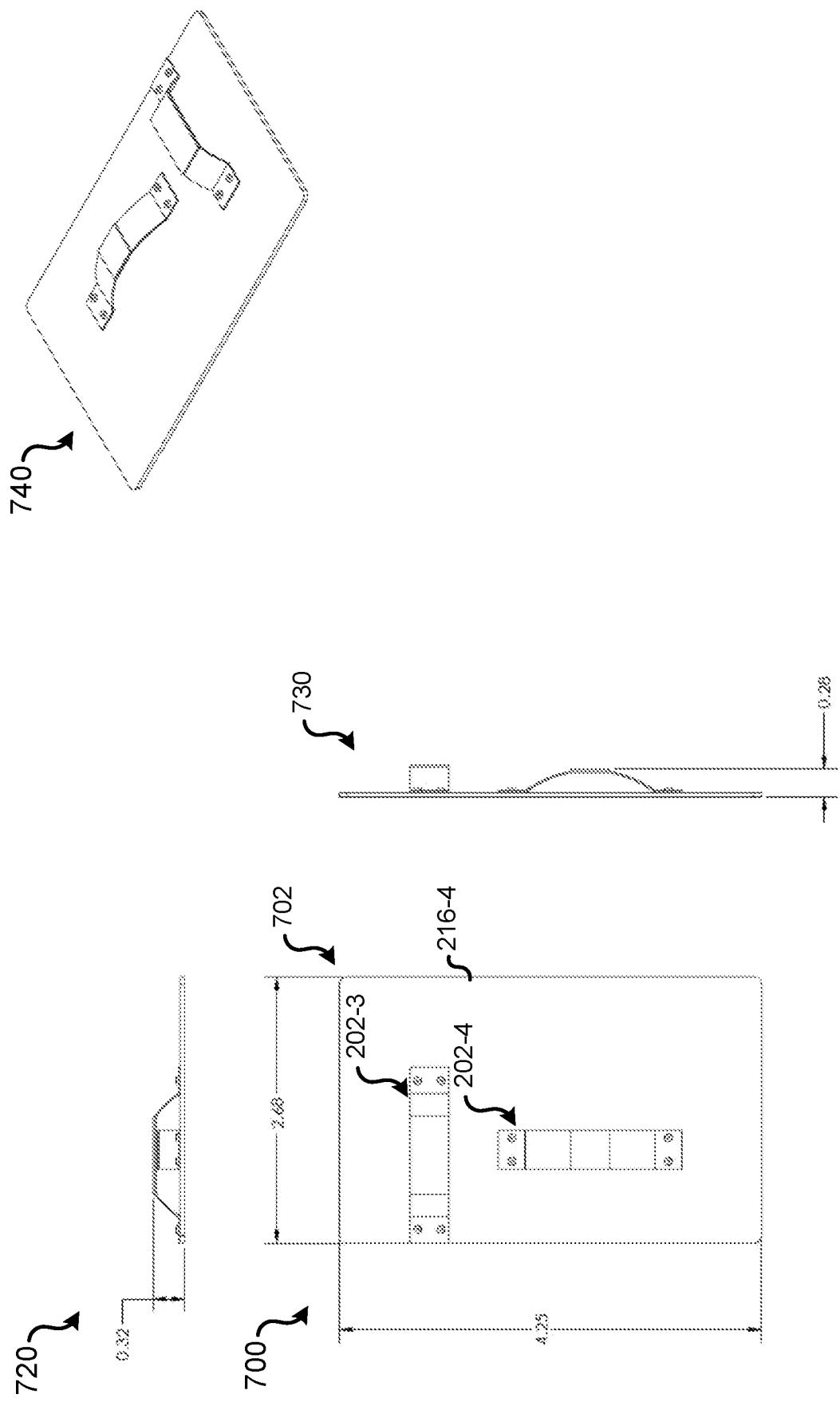
FIG. 7 illustrates a top view, side views, and a perspective view of the heat spreader assembly, in accordance with certain embodiments of the present disclosure.

FIG. 7 illustrates a top view 700, side views 720 and 730, and a perspective view 740 of the heat spreader assembly 702, in accordance with certain embodiments of the present disclosure. The heat spreader assembly 702 may include multiple closed spring systems 202-3, 202-4 coupled to a thermal expansion plate 216-4. The multiple closed spring systems 202-3, 202-4 may be configured to have varying dimensions, positions, and orientations.

Figure 8:
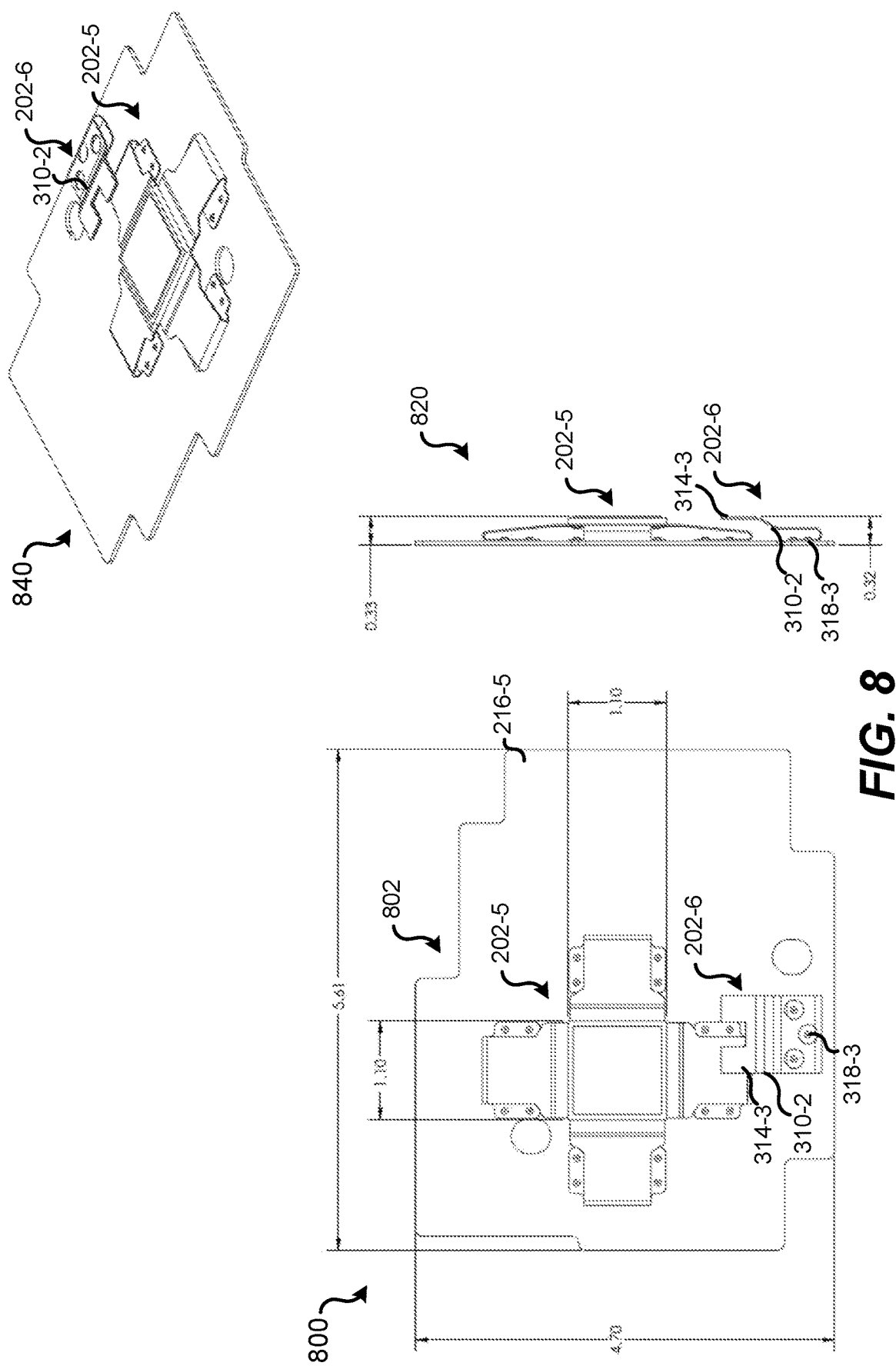
FIG. 8 illustrates a top view, a side view, and a perspective view of the heat spreader assembly, in accordance with certain embodiments of the present disclosure.

FIG. 8 illustrates a top view 800, a side view 820, and a perspective view 840 of the heat spreader assembly 802, in accordance with certain embodiments of the present disclosure. The heat spreader assembly 802 may include a combination of a four-spring spring system 202-5 and an open spring system 202-6. The open spring system 202-6 may include a single spring member 310-2. In various embodiments, the open spring system 202-6 may or may not include a thermally conductive block 314-3.

Figure 9:
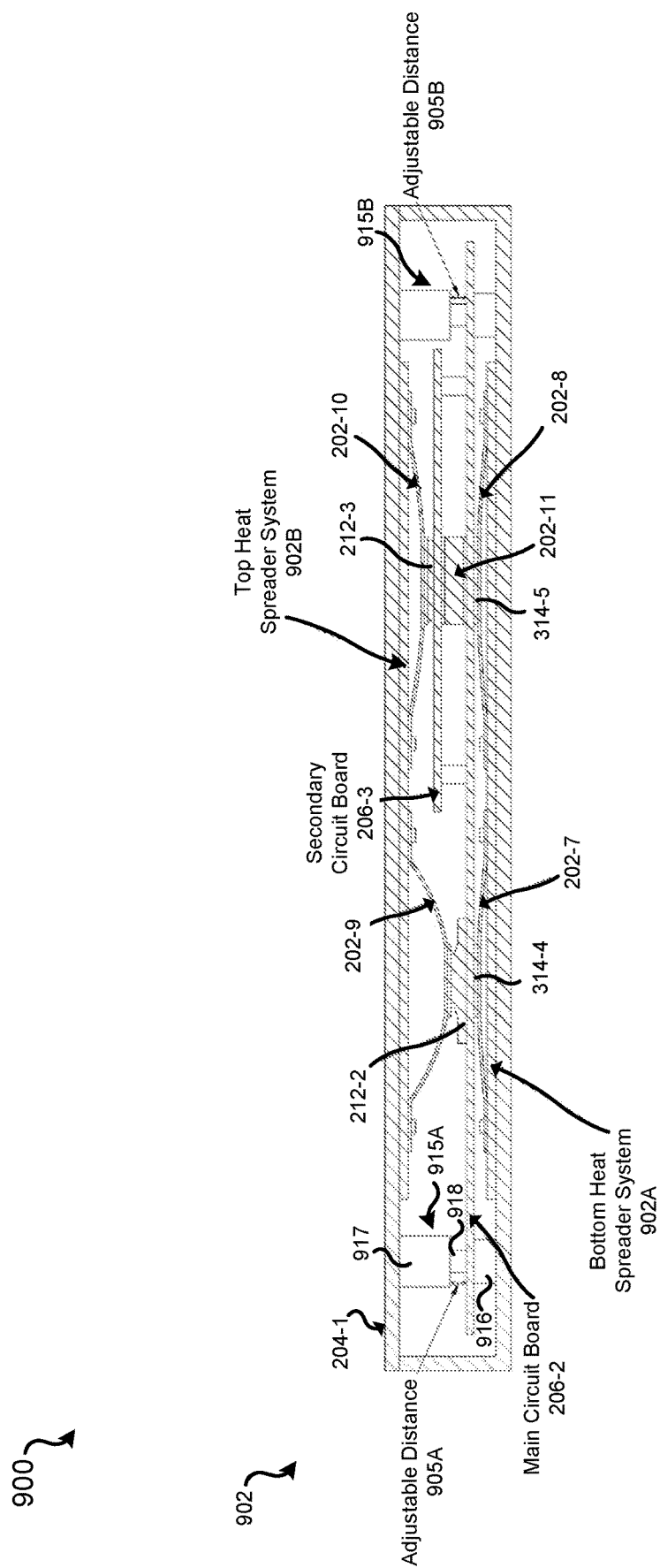
FIG. 9 illustrates a cross-section of a set-top box assembly including an opposing spring configuration to allow for a floating board and greater design tolerances, in accordance with certain embodiments of the present disclosure.

FIG. 9 illustrates a cross-section 900 of a set-top box assembly 902 including an opposing spring configuration to allow for a floating board and greater design tolerances, in accordance with certain embodiments of the present disclosure. The set-top box assembly 902 may include multiple circuit boards. The depicted example illustrates an embodiment with two circuit boards: a main circuit board 206-2 and a secondary circuit board 206-3. Other embodiments are possible, such as embodiments having a different number of main circuit boards and/or secondary circuit boards.

The main circuit board 206-2 may be supported and stabilized by a coordinated bottom heat spreader system 902A and a top heat spreader system 902B. While the illustrated embodiment specifies heat spreader systems with top and bottom denotations, certain embodiments may have various orientations of coordinated heat spreader systems, such as coordinated side orientations (e.g., left and right systems, front and back systems, etc. for vertically oriented circuit boards) and coordinated systems any suitable angles (e.g., for circuit boards oriented at any suitable angles).

Referring to the non-limiting example of FIG. 9, the bottom heat spreader system 902A may be configured to support the main circuit board 206-2 from below. The bottom heat spreader system 902A may include one or more thermally conductive spring systems disposed to make contact or indirectly support and/or stabilize the main circuit board 206-2. As illustrated, thermally conductive spring systems 202-7 and 202-8 are included in the bottom heat spreader system 902A to support and/or stabilize the main circuit board 206-2, while facilitating thermal transfer away from circuit board components (e.g., circuit board component 212-2) of the main circuit board 206-2. Some embodiments of the thermally conductive spring systems 202-7 and/or 202-8 may include a thermally conductive block 314 disposed proximate to and/or abut circuit board component(s) 212-2.

As illustrated, in certain embodiments, the secondary circuit board 206-3 may be coupled to the main circuit board 206-2. In some embodiments, the secondary circuit board 206-3 may be attached to main circuit board 206-2. Accordingly, the thermally conductive spring systems 202-7 and 202-8 in the bottom heat spreader system 902A may indirectly support and/or stabilize the secondary circuit board 206-3. In various embodiments, the secondary circuit board 206-3 may be coupled to the main circuit board 206-2 at partially with a thermally conductive spring systems 202-11 (which may be an open spring system, in some embodiments) and/or a heat sink 202-11, which may be disposed proximate to and/or abut circuit board component(s) 212-3 to facilitate thermal transfer away from circuit board components circuit board component(s) 212-3. As illustrated, thermally conductive spring systems 202-9 and 202-10 are included in the top heat spreader system 902B to support and/or stabilize the main circuit board 206-2 and the secondary circuit board 206-3, while facilitating thermal transfer away from circuit board components 212-2, 212-3.

The bottom heat spreader system 902A and the top heat spreader system 902B may be configured to allow for the main circuit board 206-2 and the secondary circuit board 206-3 to be suspended between the bottom heat spreader system 902A and the top heat spreader system 902B. Such coordinated suspension may allow for greater design tolerances with adjustable distances 905A and 905B. In various instances, the adjustable distances 905A and 905B may be equivalent or different. In various embodiments, the set-top box assembly 902 may include one or more adjustment guides 915A, 915B. The depicted example shows two adjustment guides 915A, 915B. An adjustment guide 915 may stabilize the main circuit board 206-2 and guide and/or restrict adjustments of the adjustable distances 905A and 905B. In some embodiments, the adjustment guide 915A, 915B may each include a bottom member 916 and top member 917 configured to limit the adjustable distances 905A and 905B when the main circuit board 206-2 may make contact with the bottom member 916 or the top member 917. With various embodiments, the bottom member 916 and the top member 917 may be attached to the enclosure 204. Various embodiments may include the bottom member 916 or the top member 917 being attached to the enclosure 204 in any suitable manner. Certain embodiments may include an intermediate guide member 918 that may be attached to the bottom member 916 and the top member 917 in any suitable manner. The guide member 918 may, in some embodiments, act as a lateral guide to limit and restrict the movements of the main circuit board 206-2. For example, the guide member 918 may extend through an aperture in the main circuit board 206-2 or may be disposed near an edge of the main circuit board 206-2 in order to limit, guide, and/or restrict lateral movement (e.g., movement in a direction perpendicular to the directions of the adjustable distances 905A and 905B) of the main circuit board 206-2.

Figure 10:
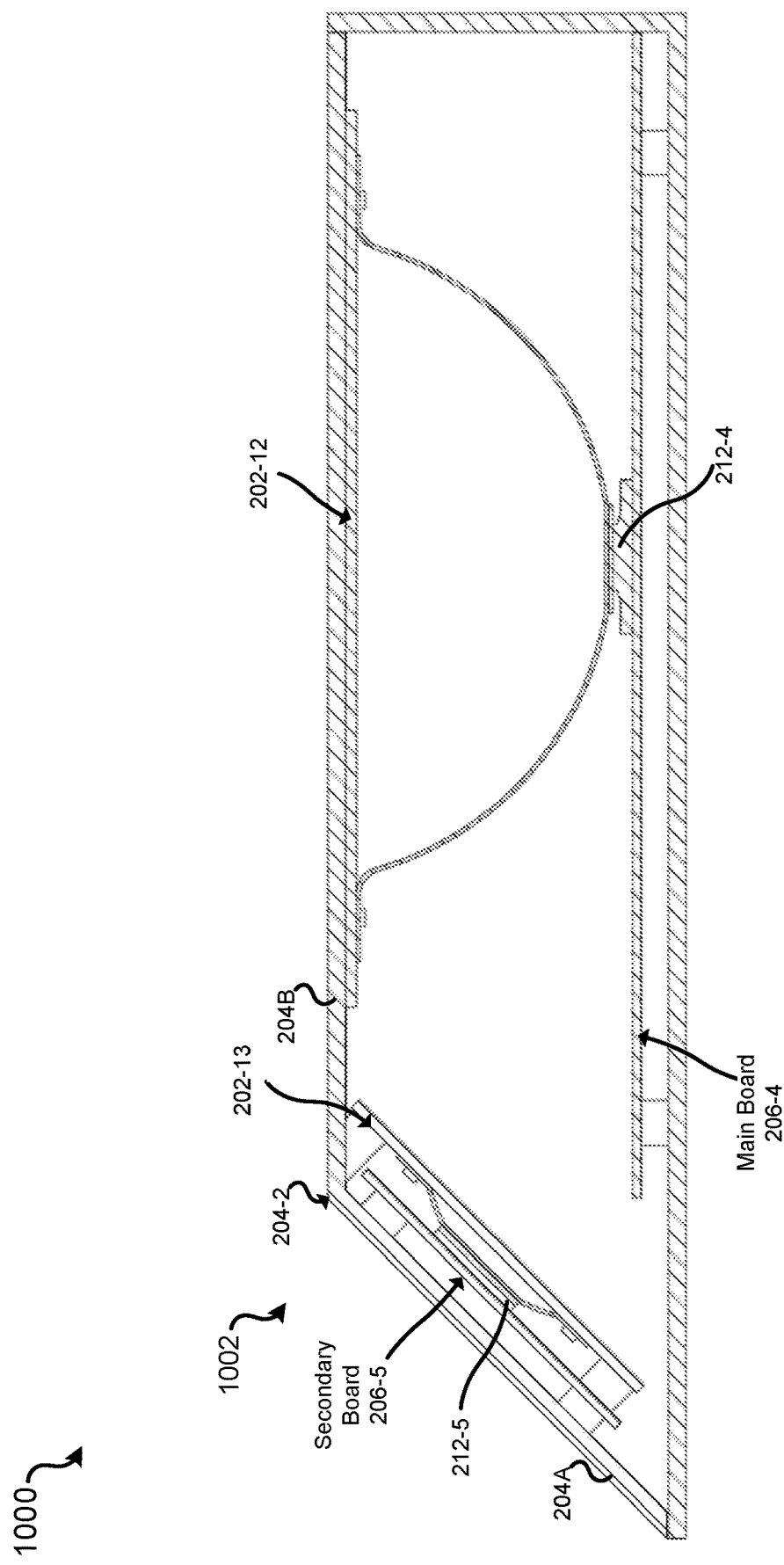
FIG. 10 illustrates a cross-section of a set-top box assembly including an a configuration that allows for adjustment to accommodate different non-parallel planes, in accordance with certain embodiments of the present disclosure.

FIG. 10 illustrates a cross-section 1000 of a set-top box assembly 1002 including an a configuration that allows for adjustment to accommodate different non-parallel planes, in accordance with certain embodiments of the present disclosure. A variety of enclosures 204 in various embodiments may have different shapes other than box shapes. For example, some enclosures 204 may have round or otherwise curved enclosures, portions that are curved, and/or portions that are acutely or obtusely angled. FIG. 10 depicts one possible enclosure 204-2 (out of many possible examples) with an angled portion. The set-top box assembly 1002 may include multiple circuit boards. The depicted example illustrates an embodiment with two circuit boards: a main circuit board 206-4 and a secondary circuit board 206-5, disposed in non-parallel planes. Other embodiments are possible, such as embodiments having a different number of main circuit boards and/or secondary circuit boards.

A heater spreader system 202, such the example depicted or another heat spreader system, may be arranged to address heat transfer from the main circuit board 206-4. The secondary circuit board 206-5, as in the illustrated embodiment, may be disposed along an angled side 204A of the enclosure 204-2. A heater spreader system 202-13 may be coupled to multiple sides 204A, 204B of the enclosure 204-2 in any suitable manner. In some embodiments, as depicted, the heater spreader system 202-13 may be directly attached to side 204B and to the secondary circuit board 206-5 in any suitable manner, such as disclosed herein. In various alternative embodiments, the heater spreader system 202-13 may be directly attached to one or more sides of the enclosure 204 without being attached to the secondary circuit board 206-5, for example, so that the heater spreader system 202-13 straddles the secondary circuit board 206-5. Other alternative embodiments may include the heater spreader system 202-13 being directly attached to the secondary circuit board 206-5 without being attached to one or more sides of the enclosure 204.

FIG. 11A illustrates a side view 1100 and a cross-section 1120 of a heat spreader assembly 1102 configured to allow for heater spreader adjustment along three axes, in accordance with certain embodiments of the present disclosure.

FIG. 11B illustrates a side view 1101 and a cross-section 1121 of the heat spreader assembly 1102 in one non-limiting example state of adjustment with respect to two axes, in accordance with certain embodiments of the present disclosure. Though bi-axial movement is depicted for the sake of simplicity, tri-axial adjustment is possible with the heat spreader assembly 1102.

As disclosed above, in various embodiments, the thermally conductive block 314 may be attached, fixedly attached, removably attached, slidably attached, pivotably attached, and/or attachable to the one or more thermally conductive spring members 310. In the depicted examples of FIGS. 11A and 11B, the thermally conductive block 314-6 may move (e.g., tilt) in two or more directions and/or orientations with respect to the spring members 310-3. The thermally conductive block 314-6 may movably connected to the spring members 310-3 with a pivoting connector 1115, which may, for example, include a ball joint filled with the thermal grease. Other embodiments, such as a sliding connector joint, are possible.

Figure 12:
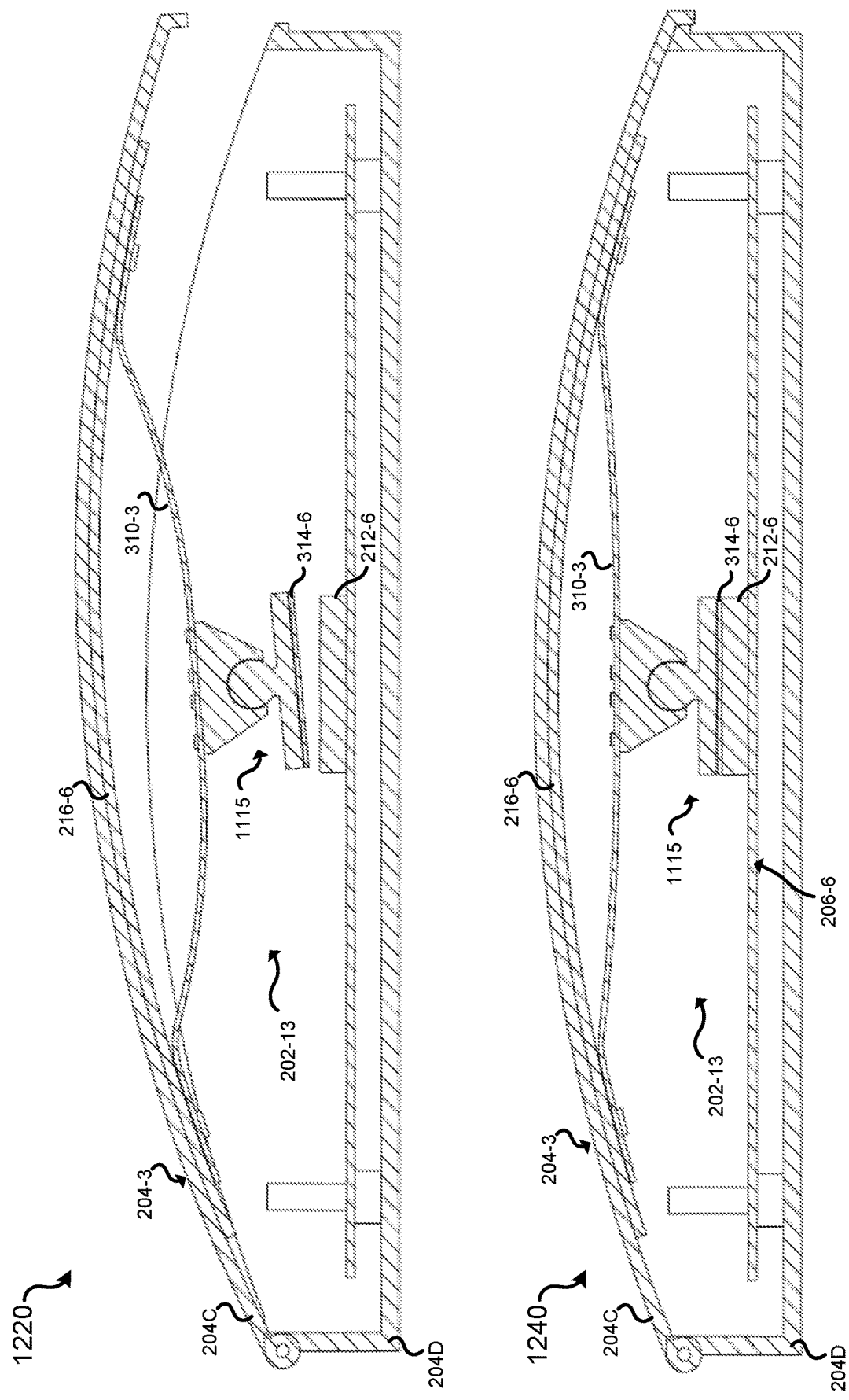
FIG. 12 illustrates a schematic, partial cross-sectional view of a set-top box assembly in an uncompressed state and a schematic, partial cross-sectional view of the set-top box assembly in a compressed state, in accordance with certain embodiments of the present disclosure.

FIG. 12 illustrates a schematic, partial cross-sectional view 1220 of a set-top box assembly 1200 in an uncompressed state and a schematic, partial cross-sectional view 1240 of the set-top box assembly 1200 in a compressed state, in accordance with certain embodiments of the present disclosure. Certain circuit board components 212 may require extra caution during application of a load with the heat spreader assembly 202. So a straight "down" (e.g., along a normal to a surface of the circuit board components 212) assembly method may be an option to apply the force evenly on the circuit board components 212 with the heat spreader assembly 202. However, if the enclosure 204 does not allow a straight down assembly method (e.g., with enclosure 204-3 where a portion 204C and a portion 204D are hingedly interconnected), the multiaxially adjusting heat spreader 202-13 may be used to evenly apply force to the circuit board component 212-6. Accordingly, certain embodiments that provide one or more points of articulation and/or single- or multi-axial adjustment may help avoid damaging circuit board components 212.

The methods, systems, and devices discussed above are examples. Various configurations may omit, substitute, or add various procedures or components as appropriate. Features described with respect to certain configurations may be combined in various other configurations. Different aspects and elements of the configurations may be combined in a similar manner. Also, technology evolves and, thus, many of the elements are examples and do not limit the scope of the disclosure or claims. Moreover, while the above description is directed to set-top box implementations, certain embodiments may be applied to other devices involving heat-producing circuit board components.

Specific details are given in the description to provide a thorough understanding of example configurations (including implementations). However, configurations may be practiced without these specific details. For example, well-known circuits, processes, algorithms, structures, and techniques have been shown without unnecessary detail in order to avoid obscuring the configurations. This description provides example configurations only, and does not limit the scope, applicability, or configurations of the claims. Rather, the preceding description of the configurations will provide those skilled in the art with an enabling description for implementing described techniques. Various changes may be made in the function and arrangement of elements without departing from the spirit or scope of the disclosure.

Also, configurations may be described as a process which is depicted as a flow diagram or block diagram. Although each may describe the operations as a sequential process, many of the operations can be performed in parallel or concurrently. In addition, the order of the operations may be rearranged. A process may have additional steps not included in the figure.

Having described several example configurations, various modifications, alternative constructions, and equivalents may be used without departing from the disclosure. For example, the above elements may be components of a larger system, wherein other rules may take precedence over or otherwise modify the application of the disclosure. Also, a number of steps may be undertaken before, during, or after the above elements are considered. Accordingly, the above description does not bind the scope of the claims.

Also, the terms in the claims have their plain, ordinary meaning unless otherwise explicitly and clearly defined by the patentee. The indefinite articles "a" or "an," as used in the claims, are defined herein to mean one or more than one of the element that the particular article introduces; and subsequent use of the definite article "the" is not intended to negate that meaning. Furthermore, the use of ordinal number terms, such as "first," "second," etc., to clarify different elements in the claims is not intended to impart a particular position in a series, or any other sequential character or order, to the elements to which the ordinal number terms have been applied.

What is claimed:

1. A system to spread heat from a circuit board component, the system comprising:
    a thermal expansion plate;
    one or more spring members coupled with the thermal expansion plate; and
    a thermal conductor adapted to contact a circuit board component, where the thermal conductor is coupled with the thermal expansion plate at least partially by way of the one or more spring members;
    where the thermal expansion plate, the one or more spring members, and the thermal conductor are configured to allow movement of the thermal conductor with respect to the thermal expansion plate along multiple axes when the thermal conductor is pressed against the circuit board component and when the one or more spring members transition to a compressed state; and
    where the thermal expansion plate, the one or more spring members, and the thermal conductor are configured to transfer heat between the circuit board component and the thermal expansion plate.

2. The system to spread heat from a circuit board component as recited in claim 1, where the thermal expansion plate, the one or more spring members, and the thermal conductor are configured to allow tri-axial movement of the thermal conductor with respect to the thermal expansion plate when the thermal conductor is pressed against the circuit board component and when the one or more spring members transition to the compressed state.

3. The system to spread heat from a circuit board component as recited in claim 2, where the thermal conductor is pivotably coupled with the one or more spring members.

4. The system to spread heat from a circuit board component as recited in claim 1, where the thermal expansion plate is coupled to an enclosure.

5. The system to spread heat from a circuit board component as recited in claim 4, where the thermal expansion plate abuts the enclosure.

6. The system to spread heat from a circuit board component as recited in claim 5, where the thermal expansion plate is coupled to a moveable portion of the enclosure that is hingedly interconnected with another portion of the enclosure.

7. The system to spread heat from a circuit board component as recited in claim 1, wherein:
one or more portions of the one or more spring members abut the thermal expansion plate and slide along the thermal expansion plate when the thermal conductor is pressed against the circuit board component and the one or more spring members transition from a first state to the compressed state.

8. The system to spread heat from a circuit board component as recited in claim 7, where the first state corresponds to an uncompressed state of the one or more spring members.

9. The system to spread heat from a circuit board component as recited in claim 1, further comprising:
additional one or more spring members, a second thermal conductor, and a second thermal expansion plate that are opposingly disposed from the one or more spring members, the thermal conductor, and the thermal expansion plate with respect to the circuit board component so that the second thermal conductor contacts the circuit board component and/or a circuit board.

10. An electronic device, comprising:
an enclosure that encloses:
a circuit board;
a circuit board component;
a thermal expansion plate;
one or more spring members coupled with the thermal expansion plate; and
a thermal conductor adapted to contact the circuit board component, where the thermal conductor is coupled with the thermal expansion plate at least partially by way of the one or more spring members;
where the thermal expansion plate, the one or more spring members, and the thermal conductor are configured to allow movement of the thermal conductor with respect to the thermal expansion plate along multiple axes when the thermal conductor is pressed against the circuit board component and when the one or more spring members transition to a compressed state; and
where the thermal expansion plate, the one or more spring members, and the thermal conductor are configured to transfer heat between the circuit board component and the thermal expansion plate.

11. The electronic device as recited in claim 10, where the thermal expansion plate, the one or more spring members, and the thermal conductor are configured to allow tri-axial movement of the thermal conductor with respect to the thermal expansion plate when the thermal conductor is pressed against the circuit board component and when the one or more spring members transition to the compressed state.

12. The electronic device as recited in claim 11, where the thermal conductor is pivotably coupled with the one or more spring members.

13. The electronic device as recited in claim 12, where the thermal expansion plate is coupled to the enclosure.

14. The electronic device as recited in claim 13, where the thermal expansion plate abuts the enclosure.

15. The electronic device as recited in claim 14, where the thermal expansion plate is coupled to a moveable portion of the enclosure that is hingedly interconnected with another portion of the enclosure.

16. The electronic device as recited in claim 10, wherein:
one or more portions of the one or more spring members abut the thermal expansion plate and slide along the thermal expansion plate when the thermal conductor is pressed against the circuit board component and the one or more spring members transition from a first state to the compressed state.

17. The electronic device as recited in claim 16, where the first state corresponds to an uncompressed state of the one or more spring members.

18. The electronic device as recited in claim 10, further comprising:
additional one or more spring members, a second thermal conductor, and a second thermal expansion plate that are opposingly disposed from the one or more spring members, the thermal conductor, and the thermal expansion plate with respect to the circuit board component so that the second thermal conductor contacts the circuit board component and/or the circuit board.

19. A method of assembling an electronic device, the method comprising:
assembling, within an enclosure:
a circuit board;
a circuit board component;
a thermal expansion plate;
one or more spring members coupled with the thermal expansion plate; and
a thermal conductor adapted to contact the circuit board component, where the thermal conductor is coupled with the thermal expansion plate at least partially by way of the one or more spring members;
where the thermal expansion plate, the one or more spring members, and the thermal conductor are configured to allow movement of the thermal conductor with respect to the thermal expansion plate along multiple axes when the thermal conductor is pressed against the circuit board component and when the one or more spring members transition to a compressed state; and
where the thermal expansion plate, the one or more spring members, and the thermal conductor are configured to transfer heat between the circuit board component and the thermal expansion plate.

20. The method as recited in claim 19, where the thermal expansion plate, the one or more spring members, and the thermal conductor are configured to allow tri-axial movement of the thermal conductor with respect to the thermal expansion plate when the thermal conductor is pressed against the circuit board component and when the one or more spring members transition to the compressed state.

* * * * *